United States Patent [19]
Hull et al.

[11] Patent Number: 5,115,151
[45] Date of Patent: May 19, 1992

[54] TRIPLE COMPARATOR CIRCUIT

[75] Inventors: Richard W. Hull, Laguna Hills; Timothy G. O'Shaughnessy, Norco, both of Calif.

[73] Assignee: Western Digital Corporation, Irvine, Calif.

[21] Appl. No.: 535,177

[22] Filed: Jun. 8, 1990

[51] Int. Cl.⁵ .............................................. H03K 5/24
[52] U.S. Cl. .................................... 307/355; 307/559; 307/568; 307/494
[58] Field of Search ............... 307/350, 355, 362, 494, 307/559, 565, 568

[56] References Cited

U.S. PATENT DOCUMENTS

| | | | |
|---|---|---|---|
| 3,956,708 | 5/1976 | Musa | 307/355 |
| 4,251,743 | 2/1981 | Hareyama | 307/254 |
| 4,644,197 | 2/1987 | Flannagan | 307/355 |

FOREIGN PATENT DOCUMENTS

| | | | |
|---|---|---|---|
| 0068884 | 1/1983 | European Pat. Off. | 307/355 |
| 0096822 | 5/1986 | Japan | 307/355 |

Primary Examiner—John Zazworsky
Attorney, Agent, or Firm—Christie, Parker & Hale

[57] ABSTRACT

A comparator which is used to compare two analog voltages and provide a single ended output comprises three CMOS differential amplifiers. The use of three differential amplifiers provides improved matching of input capacitance, and a reduction in propagation delay over prior art use of a single differential amplifier. The comparator may be adopted for use in certain CMOS processes to extend the maximum operating voltage by limiting the internal node voltages otherwise subject to damage from impact ionization. An alternative embodiment is disclosed for comparing two analog voltages that are outside the power supply voltage range.

4 Claims, 4 Drawing Sheets

TRIPLE COMPARATOR CIRCUIT

BACKGROUND OF THE INVENTION

1. Field of the Invention

This invention relates generally to differential voltage comparator circuits. In particular, the invention provides a differential voltage comparator having matched input characteristics and substantially symmetrical response to variations on either input, while providing increased speed and sensitivity.

2. Description of the Prior Art

Differential comparators typically comprise a first stage differential amplifier having a current mirrored active load with an output driving a second stage output structure. Differential comparators may be constructed using either bipolar or metal oxide semiconductors (MOS) elements. An example of the prior art using MOS technology is shown in FIG. 1.

The combination of relatively high transconductance at low current and linearity of transconductance with current for bipolar devices makes bipolar technology superior for most high speed applications of differential comparators similar to the prior art shown. However, the use of MOS devices provides simplicity in design and processing particularly where a comparator circuit is required on chip in large scale integrated circuits using MOS technology. Use of a MOS differential comparator avoids the requirement for mixing bipolar technology processing with MOS processing.

In the prior art as seen in FIG. 1, the loading condition on the two inputs, $V_X$ and $V_Y$, is typically different due to Miller feedback capacitance of the normally connected leg of the differential structure as opposed to the diode connected leg. This difference in loading conditions may significantly affect response of the circuit to inputs having matched output impedance or may adversely affect the circuit structures providing the input. Further, because of the difference in the differential structure, switching speed of the output is dependant upon which of the input values $V_X$ or $V_Y$ varies. Switching of the differential output to a high condition may be substantially longer than switching low. When input $V_X$ is less than input $V_Y$, current through the diode connected transistor in the active load becomes greater thereby charging the common gate node of the current mirror. This node has gate to source capacitance of both transistors of the current mirror. As the common gate node charges, the mirrored transistor sinks current from the differential output until a steady state is reached. Conversely, when $V_Y$ decreases below $V_X$, additional current is sourced directly to the differential output. The higher capacitance of the common gate node of the current mirror therefore delays the transfer of steady state differential output current when sinking current as opposed to sourcing current.

In a MOS application in the prior art, overall speed of the differential comparator may be recovered to some extent by reducing gate length of the input MOS devices to increase their transconductance. As gate length is decreased, however, voltage gain, which is limited by the drain impedance of the MOS devices, decreases. This reduction in gain is undesirable for the comparator since overall accuracy of the device is reduced. Similarly, if width of the MOS input devices is increased to provide increased transconductance greater parasitic node capacitance will exist at the output of the differential stage. The improvement in delay time across the device therefore decreases with increasing device width, but approaches an asymptotic limit. In addition, increased device width increases the overall input capacitance of the comparator resulting in an increase in overall delay of the circuit when devices providing $V_X$ and $V_Y$ inputs to the comparator have significant output impedance thereby increasing the time to charge the input capacitance of the circuit.

Prior art comparator circuits embodied in MOS devices encounter an additional problem when input voltages to be compared become large. This condition requires the power supply voltage for the differential comparator to be increased to permit proper operation at higher operation voltages. When $V_X$ is significantly greater than $V_Y$, impact ionization may occur at the drain of the normally connected MOS device in the current mirror load. If impact ionization occurs, the MOS transistor may degrade over time. Such degradation results in excess input offset voltages, a loss of voltage gain and increased delay in the circuit.

SUMMARY OF THE INVENTION

The present invention provides a comparator with high voltage gain, reduced step response delay, symmetrical input impedance, and substantially symmetrical delay through the circuit, thus eliminating many of the shortcomings of prior art devices. Further, implementation of the invention in MOS circuitry, provides a device with immunity to impact ionization for N-channel devices in the circuit.

The invention is a differential comparator circuit employing two differential amplifiers receiving the inputs to the comparator and driving a third differential amplifier to provide the output from the comparator. The first differential amplifier has a first input connected to the first signal source and a second input connected to the second signal source. The second differential amplifier is identical to the first differential amplifier, however, the inputs to the second differential amplifier are connected to the input signal sources oppositely from the first differential amplifier. The first input of the second differential amplifier is connected to the second signal source while the second input of the second differential amplifier is connected to the first signal source. The outputs of each of the first and second differential amplifiers are provided to the third differential amplifier. The output of the third differential amplifier is then provided to an output structure for the comparator.

A voltage clamp is provided on each of the inputs to the third differential amplifier to limit voltage on the inputs on the third differential amplifier. Voltage transition time at the third differential amplifier in response to a changing input is thereby reduced. The voltage clamps on the inputs provide a further benefit in the invention by limiting the voltage at the output node of each of the first and second differential amplifiers, thereby precluding impact ionization of N-channel MOS devices in the normally connected leg of the current mirror in the first and second differential amplifiers.

DETAILED DESCRIPTION OF THE INVENTION

Figure 1:
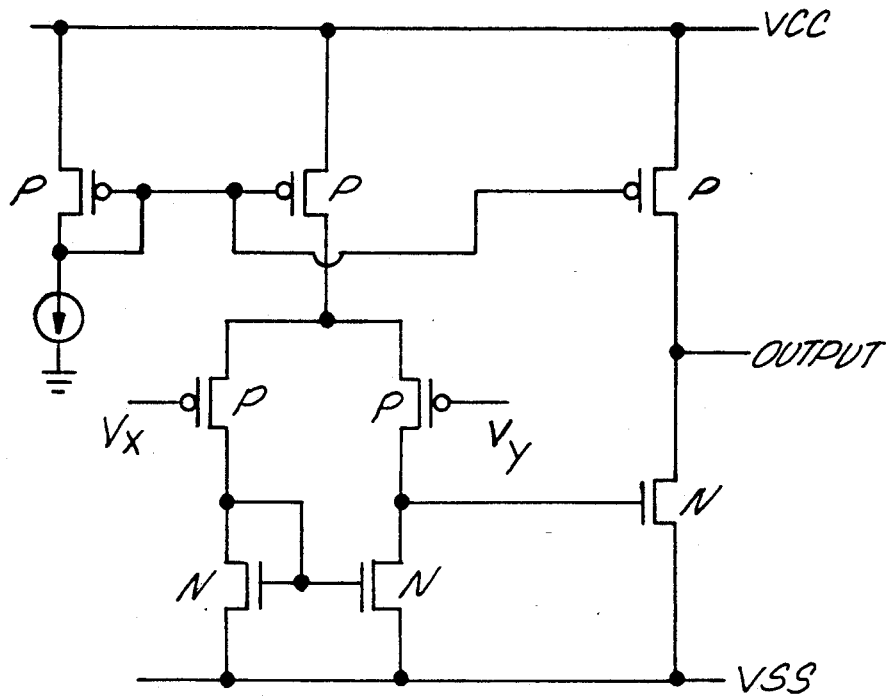
FIG. 1 is an example of a prior art single differential structure comparator circuit using MOS devices.
Figure 2:
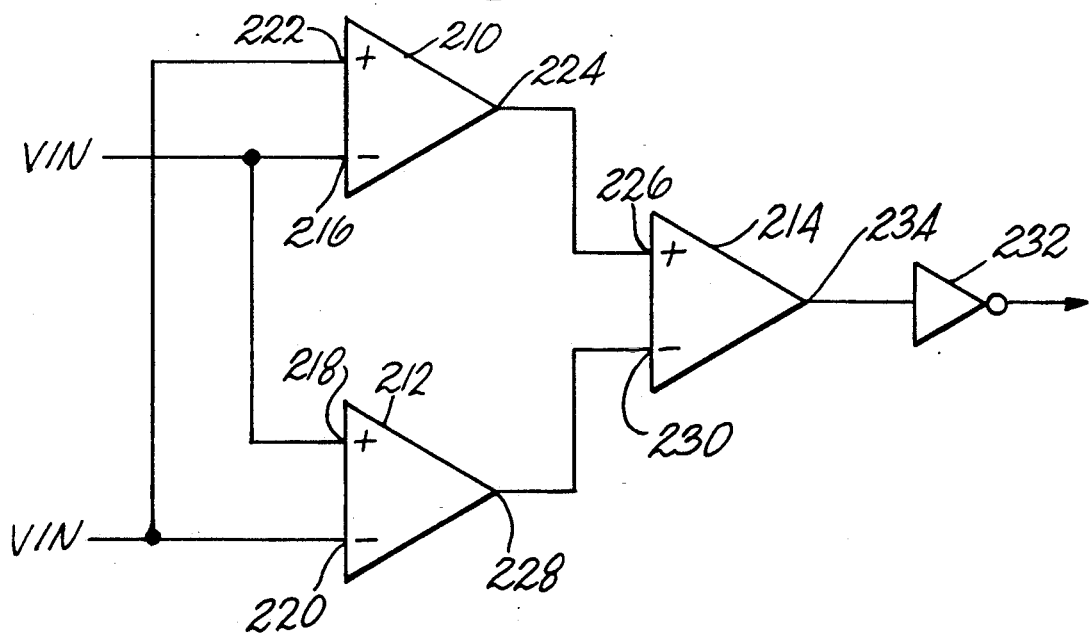
FIG. 2 is a block diagram of the triple comparator arrangement of the present invention.

The preferred embodiment of the invention as shown in the drawings is implemented using MOS technology. Referring now to FIG. 2, the invention comprises a first differential amplifier 210, a second differential amplifier 212, and a third differential amplifier 214. A first input signal, VIN, is connected to the inverting input 216 of the first amplifier and the noninverting input 218 of the second amplifier. A second input signal VIN- is connected to the inverting input 220 of the second amplifier and the noninverting input 222 of the first amplifier. The differential structure of the first and second amplifier are identical in design, therefore, each of the input signals sees the input impedance of an inverting input combined with the input impedance of a noninverting input.

The output 224 of the first differential amplifier is connected to the noninverting input 226 of the third differential amplifier. The output 228 of the second differential amplifier is connected to the inverting input 230 of the third differential amplifier. An output stage comprising an invertor 232 is connected to the output 234 of the third differential amplifier. The output stage provides isolation from the output load of the comparator, thereby preventing influencing of the output signal slope on the third differential amplifier. Additional gain is also provided by the invertor to improve the accuracy of the comparator.

Figure 3:
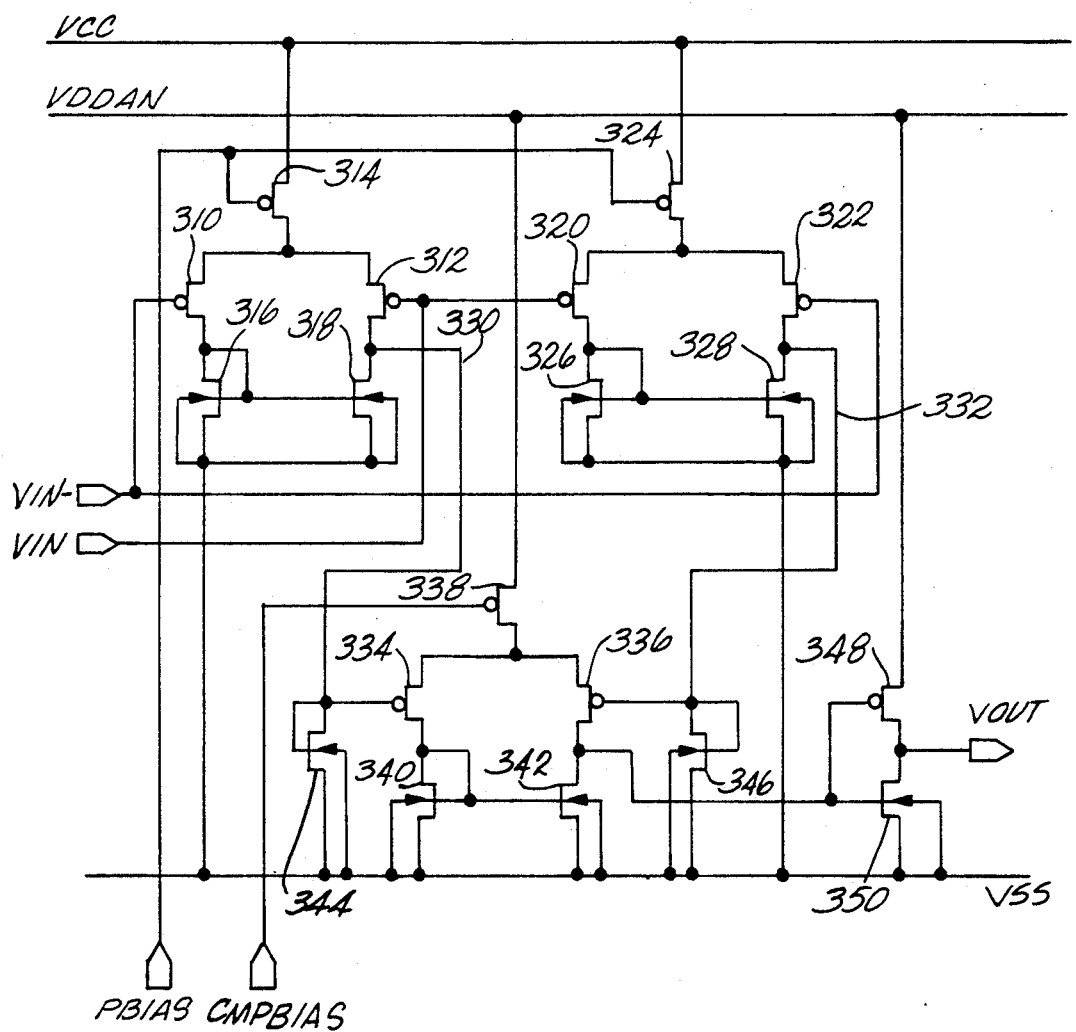
FIG. 3 is a circuit schematic of the present invention implemented using MOS devices.

A detailed schematic of the preferred embodiment of the invention is shown in FIG. 3. The first differential amplifier consists of a first P Channel MOS device 310 and a second P Channel MOS device 312 acting respectively as the noninverting and inverting inputs. A third P Channel device 314 provides the current source for the first differential amplifier. An active current mirror load consisting of diode connected N Channel device 31 and normally connected N Channel device 318 completes the first differential amplifier.

The second differential amplifier is constructed identically to the first having a first P Channel MOS device 320 as the noninverting input transistor; a second P Channel MOS device 322 as the inverting input transistor; a third P Channel MOS device 324 acting as the current source for the differential amplifier and an active current mirror load consisting of a diode connected N Channel MOS device 326 and a normally connected MOS device 328.

The first input signal, VIN is provided to the inverting input of the first differential amplifier by connection to the gate of N Channel device 312. VIN is also provided to the noninverting input of the second differential amplifier by connection to the gate of P-Channel device 320. The second input signal VIN- is provided to the noninverting input of the first differential amplifier by connection to the gate of P Channel device 310 and provided to the inverting input of the second differential amplifier by connection to the gate of P Channel device 322. Since the structure of the first and second differential amplifier are identical, the input impedances seen by input signals VIN and VIN- are identical. As previously described for the prior art, a time delay for the signal output from a differential amplifier is dependent on which leg of the differential structure receives the changing input. Using the first differential amplifier as an example, a reduction of the voltage of input signal VIN- would allow greater current to flow through P-channel device 310. This current would charge the common gate node of the current mirror comprised of N-channel devices 316 and 318. This charging time is dependent upon the capacitance of the gate node. If, however, a voltage reduction in signal VIN is imposed, additional current will flow through P-Channel device 312 directly to the output node of the first differential amplifier. As for the prior art devices, the differential amplifier responds more rapidly as a current source than as a current sink. In the present invention, however, the input signals VIN and VIN-, are each attached to the fast leg of the differential structure present in one of the differential amplifiers and a slow leg of the differential structure in the second amplifier. The response time to a change in either signal is therefore the response time of the fast leg of the differential amplifier.

The output 330 of the first differential amplifier and the output 332 of the second differential amplifier, are provided to the third differential amplifier. The third differential amplifier is similar in structure to the first and second amplifiers having a P-Channel MOS device 334 as the non-inverting input transistor; second P-Channel MOS device 336 as the inverting input transistor; third P-Channel device 338 providing the current source for the differential amplifier and an active current mirror load consisting of diode connected N Channel device 340 and normally connected N-Channel device 342.

While the third differential amplifier does now provide an impedance imbalance, the output impedance of the first and second differential amplifiers may be significantly less than the output impedance of the original signal sources providing VIN and VIN-. This significantly mitigates the impact of the input impedance imbalance of the third differential amplifier. Further, this imbalance is isolated from the input signals by the first and second differential amplifier structures.

A voltage clamp is provided on the output of each of the first and second differential amplifiers. A first diode connected N Channel device 344 is connected between the output 330 of the first differential amplifier and the gate of the noninverting input transistor of the third differential amplifier P Channel device 334. Similarly, diode connected N Channel device 346 is connected between the output 332 of the second differential amplifier and the gate of the inverting input transistor P Channel device 336.

A first source voltage $V_{CC}$, nominally 12 volts in the preferred embodiment, is connected to the source of P Channel devices 314 and 324. The gates of P Channel devices 314 and 324 are biased through input biasing signal PBIAS, which may be provided by a current source driven diode connected MOS device or other similar means. A second source voltage $V_{DDAN}$, is connected to the source of P Channel device 338 to provide source current for the third differential amplifier. In the preferred embodiment, $V_{DDAN}$ is nominally 5 volts. The gate of P Channel device 338 is connected to a comparator bias CMPBIAS. A ground connection AGND is provided for source connection of the N Channel MOS devices in the circuit.

The output stage of the comparator consists of a MOS invertor having a P Channel MOS device 348 in a common drain connection with N Channel device 350. The output of the comparator VOUT is taken from the common drain node.

Figure 4:
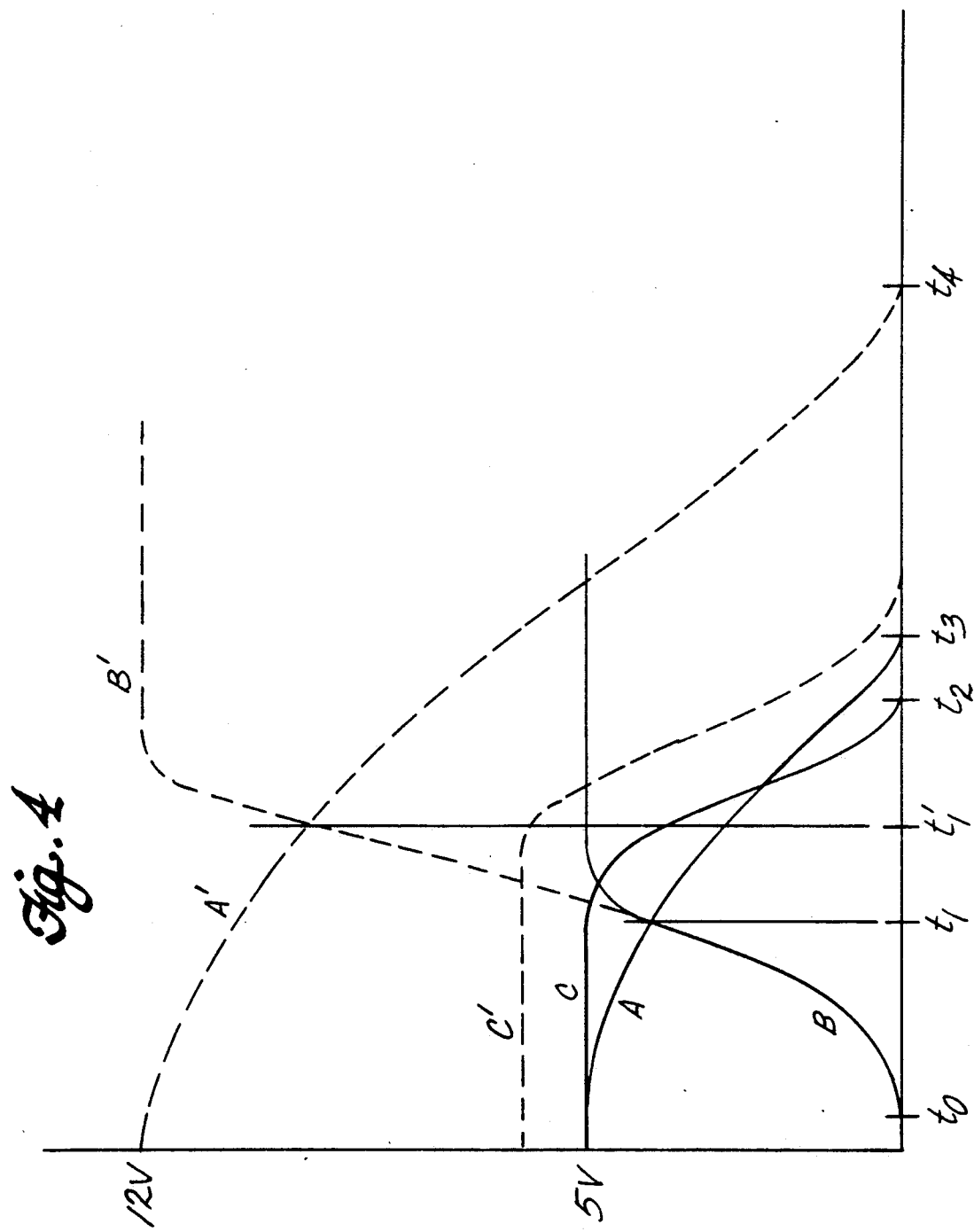
FIG. 4 is a timing diagram for example input signals, intermediate and output signals of the invention.

Operation of the comparator may be understood by referring to the timing diagram shown in FIG. 4. For initial condition of VIN less than VIN-, the output of the first differential amplifier represented by curve A would be high at time $t_0$. The output of the second differential amplifier, as represented by curve B would be low at time $t_0$. A transition from the initial condition of VIN<VIN- to VIN>VIN- at time $t_0$, results in a charging of the common gate node of the current mirror in the first differential amplifier which causes voltage at the output of the first differential amplifier to begin to decrease. VIN exceeding VIN- on the inputs to the second differential amplifier, results in current sourcing at the output of the second differential amplifier beginning to charge the gate capacitance of the inverting input of the third differential amplifier. Due to the more rapid current sourcing capability of the second differential amplifier, voltage increase on the inverting input of the third differential amplifier exceeds the rate of voltage decrease on the noninverting input. At time $t_1$, the voltage on the inverting input of the third differential amplifier exceeds the voltage on the noninverting input, thereby steering current to begin charging the gate node of the current mirror on the third differential amplifier. The output of the third differential amplifier begins to discharge voltage from the gate capacitance of the MOS invertor output stage as represented by curve C.

DC gain of the first and second differential amplifiers is maintained high to provide accuracy in the comparator. As previously described, however, additional speed in an amplifier differential structure may be obtained by reducing the gate lengths to increase transconductance of the devices in the differential structure. A resulting decrease in gain is suffered, however, since high gain for accuracy is provided by the first and the second differential amplifiers, the third differential amplifier may have reduced gate lengths on the input P Channel devices to increase transconductance and, therefore, speed of the third differential amplifier. Sufficient increase in transconductance to provide additional current sinking capability for discharging the gate capacitance of the invertor output stage allows the output of the third differential amplifier to reach a low condition at time $t_2$ before the slow leg of the first differential amplifier reaches a low condition at $t_3$. The speed of the present invention, therefore, exceeds that of a comparable single stage differential comparator having gain equivalent to the first stage differential amplifiers of the present comparator. Additional gain is provided in the present comparator by the third differential amplifier which has an inherent gain of two based on the opposite configuration of inputs from the first and second differential amplifiers. The reduction of the DC gain in the third differential amplifier to improve speed, therefore, does not significantly affect the accuracy of the comparator.

Propagation of the signal through the third differential amplifier for an initial condition of VIN>VIN- with a transition to VIN<VIN- is faster than previously described since the transition in the third differential amplifier is now in the fast leg of the differential structure providing current sourcing from the third differential amplifier as opposed to current sinking. The resulting average propagation delay for the triple comparator of the present invention is significantly improved over prior art single stage differential comparator structures.

Returning to FIG. 2, voltage clamping provided by N-channel devices 344 and 346 enhances the performance of the comparator by limiting the maximum voltage at the inverting and the noninverting inputs of the third differential amplifier. In the preferred embodiment, voltage is clamped at 5 volts or less. Without the voltage clamping, the high condition on the output of the first differential amplifier would be nominally 12 volts as shown by curve A' in FIG. 4. Upon initiation of a transition at time $t_0$, voltage decay on the output of the first differential amplifier and gate of the noninverting input to the third differential amplifier, as shown by curve A', and voltage increase on the output of the second differential amplifier and gate of the inverting input to the third differential amplifier as represented by curve B' do not reach a crossover point until time $t_1'$. The response of the third differential amplifier is then shown by curve C' which has been offset for clarity in FIG. 4. The resulting delay without clamping in switching of the third differential amplifier significantly increases the overall propagation delay of the comparator.

The use of the nominal 12 volt power supply voltage, VCC provides extended operating voltage range for the input signals VIN and VIN-. The nominal 5 volt power supply voltage VDDAN provides an output voltage swing compatible with the digital logic operating at a power voltage near 5 volts.

Figure 5:
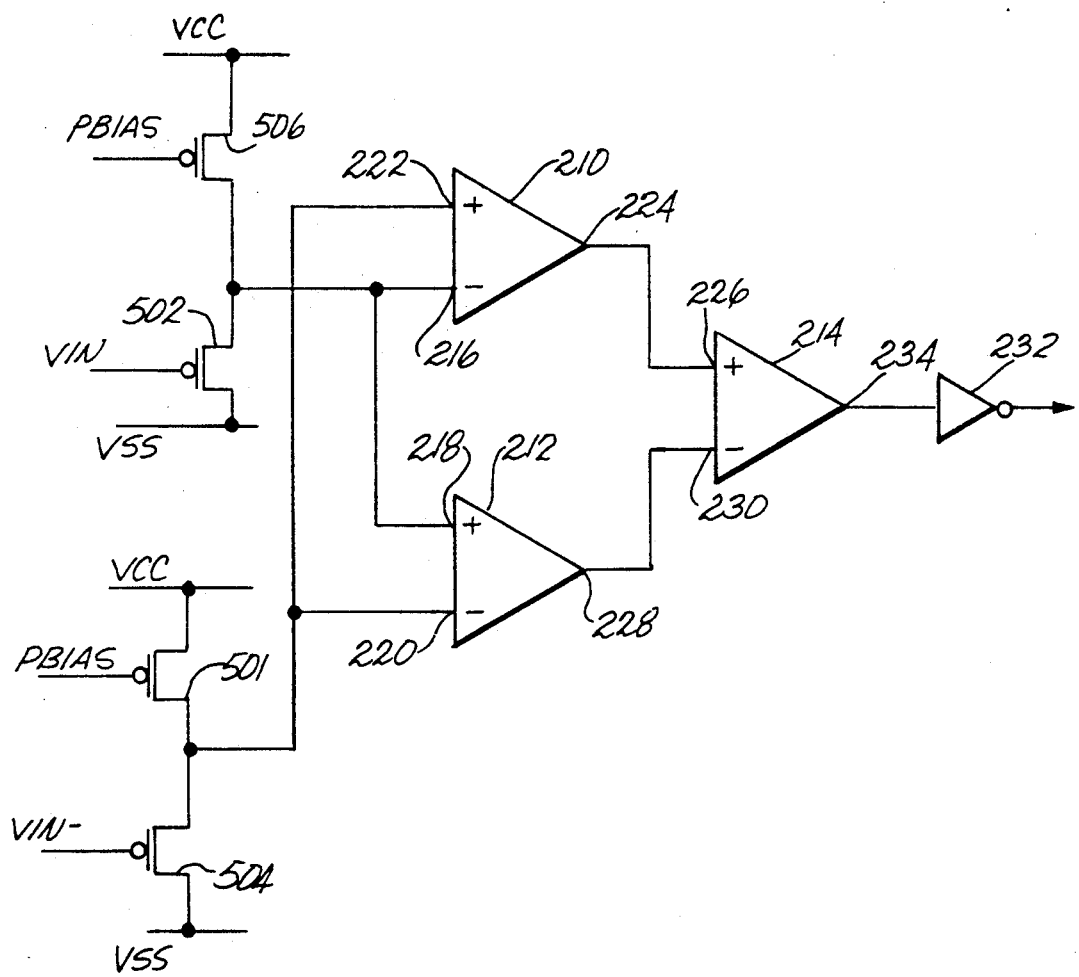
FIG. 5 is an alternative embodiment of the invention used to extend operation of the comparator for input signals that may have negative potentials to a predetermined value.

FIG. 5 shows another embodiment of the invention using a level shifting circuit for extending operation of the comparator for input signals VIN and VIN-, which may be near or below the ground potential VSS. The input signal VIN is applied to the gate of P-Channel transistor 502, and the input VIN- is applied to the gate of the P-Channel transistor 504. The P-Channel transistors 506 and 508 each have the gate electrodes connected to PBIAS, and the source electrodes connected to VCC. The drain of transistor 506 is connected to the source of transistor 502, and the drain of transistor 508 is connected to the source of transistor 504. The source of transistor 502 is connected to comparator inputs 216 and 218. The source of transistor 504 is connected to the comparator inputs 220 and 222. In this configuration, transistors 506 and 508 provide nearly equal bias currents of predetermined value to transistors 502 and 504. Transistors 502 and 504 operate as source followers to input signals VIN and VIN- respectively. Transistors 502 and 504 are geometrically matched and therefore provide nearly equal voltage shift from gate to source. Therefore, input signals operating below the ground potential VSS to a predetermined worst case value are level shifted above the ground potential VSS. In a like manner, input signals operating above the power supply potential VCC may be level shifted using an N Channel level shifting structure and by using N Channel input structures on the first and second differential amplifiers 210 and 212.

Having now described the present invention in detail, as required by the patent statues, those skilled in the art will recognize alternate embodiments of the circuit, such as substitution of P channel and N channel devices for a MOS embodiment or use of the invention with bipolar technology. Such modifications to the invention are within the scope and spirit of the invention as defined in the following claims.

What is claimed is:

1. A high impedance differential comparator circuit having symmetrical delay comprising;
   a first MOS differential amplifier having a first input, a second input and an output, the first input connected to a first signal source and the second input connected to second signal source;
   a second MOS differential amplifier identical to the first differential amplifier having the first input connected to the second signal source and the second input connected to the first signal source;
   a third MOS differential amplifier having a first input connected to the output of the first differential amplifier, a second input connected to the output of the second differential amplifier and an output; and,
   means for clamping the outputs of the first and second differential amplifiers thereby providing a maximum limit on voltage at the first and second inputs to the third differential amplifier.

2. A high impedance differential comparator circuit having symmetrical delay comprising:
   first and second current source biased MOS differential amplifiers with active current mirror loads, each amplifier having a first input, a second input, and an output, the first input of the first amplifier and the second input of the second amplifier connected to a first signal source and the second input of the first amplifier and the first input of the second amplifier connected to a second signal source;
   a third current source biased MOS differential amplifier having an active current mirror load and having a first input connected to the output of the first amplifier and a second input connected to the output of the second amplifier and an output;
   a first diode connected MOS device drain connected intermediate the output of the first amplifier and the first input of the third amplifier;
   a second diode connected MOS device drain connected intermediate the output of the second amplifier and the second input of the third amplifier; and,
   a MOS invertor stage connected to the output of the third amplifier.

3. A comparator circuit as defined in claim 2 further comprising means for biasing the current sources of the first and second amplifiers and means for biasing the current source of the third amplifier.

4. A differential comparator circuit as defined in claim 3 further comprising a first voltage supply connected to the current sources of the first and second amplifiers and a second voltage supply connected to the current source of the third amplifier and the MOS invertor stage.

* * * * *